United States Patent [19]

Conrad et al.

[11] Patent Number: 4,544,851
[45] Date of Patent: Oct. 1, 1985

[54] SYNCHRONIZER CIRCUIT WITH DUAL INPUT

[75] Inventors: Marvin Conrad; Karl M. Guttag; John V. Schabowski, all of Houston, Tex.; Derek Roskell, Northants, England; Jim A. Carey, Bedford, England; Brian Shore, Beds, England

[73] Assignee: Texas Instruments Incorporated, Dallas, Tex.

[21] Appl. No.: 298,035

[22] Filed: Aug. 31, 1981

[51] Int. Cl.[4] .................. H03K 17/30; H03K 19/096; H03K 17/693

[52] U.S. Cl. ..................................... 307/480; 307/279; 307/269; 307/443; 307/582; 328/201

[58] Field of Search ............... 307/443, 448, 453, 464, 307/475, 480, 481, 527, 528, 362, 238.6, 279, 582, 269; 328/63, 72, 110, 139, 201; 365/233; 377/71, 78

[56] References Cited

U.S. PATENT DOCUMENTS

| | | | |
|---|---|---|---|
| 3,916,223 | 10/1975 | Fette et al. | 307/269 X |
| 3,947,697 | 3/1976 | Archer et al. | 328/63 X |
| 4,011,465 | 3/1977 | Alvarez, Jr. | 307/481 |
| 4,035,663 | 7/1977 | Stodola | 307/269 X |
| 4,282,489 | 8/1981 | De Rienzo | 307/355 X |
| 4,317,053 | 2/1982 | Shaw et al. | 307/269 |
| 4,380,736 | 4/1983 | Pfaff | 307/269 X |

OTHER PUBLICATIONS

Chaney et al., "Beware the Synchronizer", COMPCON-72, IEEE Computer Society Conference, San Francisco, Ca., Sep. 12-14, 1972.
Elineau et al., "A New JK Flip-Flop for Synchronizers", *IEEE Transactions on Computers*, vol. C-26, No. 12, 12-1977, pp. 1277-1279.
Chaney et al., "Anomalous Bahavior of Synchronizer and Arbiter Circuits", *IEEE Transactions on Computers*, vol. C-22, No. 4, 4-1973, pp. 421-422.
Marino, "The Effect of Asynchronous Inputs on Sequential Network Reliability", *IEEE Transactions on Computers*, vol. C-26, No. 11, 11-1977, pp. 1082-1090.

*Primary Examiner*—Larry N. Anagnos
*Assistant Examiner*—David R. Hudspeth
*Attorney, Agent, or Firm*—Thomas E. Tyson; Leo N. Heiting; Melvin Sharp

[57] ABSTRACT

A digital synchronizer circuit including an input to receive an asynchronous level and a second input to receive an ansynchronous pulse. Both inputs are connected to the synchronizer input circuitry which will provide a level output for either type of input signal. This circuitry is connected to the remainder of the digital synchronizer which includes a latch connected to the level input and a level sensitive circuit connected to the output of the latch. The latch is constructed to provide a rapid transition between a logic "0" and "1". In addition, the latch is periodically cleared. The level sensitive circuit provides a propagation barrier to any metastable state that may be present in the latch. However, the level sensitive circuit is also constructed for rapid transition from a logic "0" to a logic "1" when such a state occurs within the latch. An additional latch is connected in a further embodiment to provide additional reliability of the synchronizer circuit. The second latch is a two inverter latch with refresh for a three quarter of a machine cycle to allow any transient conditions within the latch to dampen out.

14 Claims, 12 Drawing Figures

SYNCHRONIZER CIRCUIT WITH DUAL INPUT

BACKGROUND

1. Field of the Invention

This invention relates to synchronizers for digital logic networks, computers and synchronous sequential networks and is in the general area as copending U.S. patent application Ser. No. 285,207 to Guttag, et al which is assigned to the assignee of the present invention.

2. Description of the Prior Art

Modern computers are synchronous in nature. That is, they include synchronous sequential networks that are regulated by clock pulses. This synchronous nature is a result of the ease of design and integration of smaller sequential circuits contained on integrated chips. However, to interface to the external world, the sequential networks must also interface with asynchronous inputs. A asynchronous signal is a signal that occurs at some time not subject to the regulation of the clock circuitry for the synchronous circuit. The requirement for an input to the synchronous network is the asynchronous signal be maintained so that the synchronous circuit can detect its presence. In previous computers this has been done with a flip flop. In other words, the asynchronous signal is an input to a flip flop which is clocked by the internal clock of the asynchronous system. The existence of the asynchronous input is then stored as a level output of the flip flop. After this input has been acknowledged, the flip flop is then cleared in order to receive additional asynchronous inputs. Problems with this circuit can occur when the flip flop is being cleared at the same time an asynchronous event occurs. In other words, as the circuit is being clocked, the asynchronous level is being raised. At the falling edge of the clock, the occurrence of an asynchronous signal can place the flip flop in what is termed a metastable condition. This is a condition in the flip flop where the flip flop is between a logic 0 and a logic 1. The logic 0 and the logic 1 states are representative of the output voltages of the flip flop. In the metastable state the voltage maintained by the flip flop is between the regions designated for logic 0 and logic 1. The probability of this type of condition occurring is directly related to the speed of the machine since the speed of the device determines the rate that the flip flop receives the clock signal and thus determines the number of clock falling edges present per unit time. As the speeds of synchronous devices increases, the occurrence of this asynchronous interface problems becomes more prelevant.

Many articles have been written about the asynchronous interface problem. The solution suggested include the use of synchronizers to synchronize the occurrence of the asynchronous event with the synchronous circuit clock. One such paper is "Beware the Synchronizer" by T. J. Chaney, F. M. Ornstein and W. M. Littlefield, COMPCON-72, IEEE Computer Society Conference, San Francisco, Calif., Sept. 12-14, 1972. This paper suggested the use of a flip flop with a metastable detector. In other words, a circuit that detects the existence of a metastable condition in the flip flop. Another solution suggested by G. Elineau and Warner Wieabeck in IEEE Transactions on Computers, Vol. C-26, No. 12, December 1977, p 1277-1279 includes a new type of JK flip flop for synchronizers. This flip flop is specifically developed for synchronizer circuits and allows the internal clock of the synchronizer circuit to operate at a higher speed. A third solution suggested by Leonard Marino in his paper, "The Effect of Asynchronous Inputs on Sequential Network Reliability", in IEEE Transactions on Computers, Vol. 26, No. 11, November 1977, p. 1082-1090 is the use of delays to allow the flip flops to settle to a stable state to prevent any so called runt pulses from generating metastable conditions. However, another paper by T. J. Chaney and C. E. Molner entitled, "Anomalous Behaviour of Synchronizer and Arbitrator Circuits", appearing in the IEEE Transactions on Computers, Vol. C-22, No. 4, April 1973, pp 421-422, states that use of delays will not completely solve the problem but only allow for some improvement. Therefore, the prior art allows certain solutions to improve the performance of synchronizers, but the goal of synchronizer reliability is still elusive. The goal for synchronous system designers is to design a synchronizer with reliability that is as great as the reliability of the component in the synchronous circuits.

SUMMARY OF THE INVENTION

In accordance with the present invention, a digital synchronizer for connecting to an asynchronous system is provided which includes dual inputs to receive an asynchronous level input or an asynchronous pulse input. These two inputs are converted by the digital synchronous input circuit into a level input signal which is connected to a storage capability to store the occurrence of the input. The storage capability output is connected to a circuit that will only produce an output upon the reception of a predetermined input voltage. The digital synchronizer is connected to a synchronous system in order to prevent the propagation of any metastable condition caused by asynchronous inputs.

In one embodiment of the invention, a digital synchronizer is provided which includes input circuitry to receive asynchronous level and asynchronous pulses. The output of this input circuitry is a level which is then connected to storage circuitry. The storage circuitry output is connected to a level sensitive circuitry that is designed to produce an output only upon the reception of an input voltage level greater than a metastable voltage level of the storage circuitry.

In a further embodiment of this invention, input circuitry produces level output upon the reception of an asynchronous level or an asynchronous pulse input is connected to storage circuitry which is in turn connected to a level sensitive circuit which will produce an output voltage upon receiving and an input voltage of a level greater than a metastable voltage level for the storage circuitry. In addition, a latch is connected to the output of the level sensitive circuit that will store the occurrence of the output voltage from the level sensitive circuit. This latch is refreshed for a period that will allow any transient conditions to die out.

DETAILED DESCRIPTION OF THE INVENTION

Figure 1:
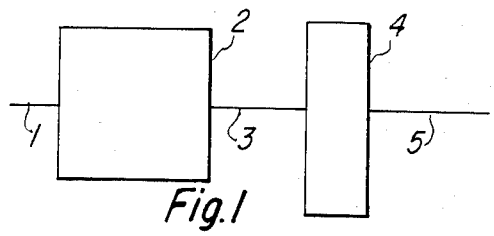
FIG. 1 is a block diagram of an embodiment of the synchronizer.

The purpose of a synchronizer circuit is to receive an asynchronous event and interface this occurrence with a synchronous system. Referring to FIG. 1, the asynchronous input occurs on line 1. This asynchronous input occurs as a level input. The block numbered 2 receives this input and maintains a level on line 3 to indicate the occurrence of the asynchronous event on line 1. The block numbered 4 prevents the propagation of any metastable state that occurs in block 2 from being transmitted through to line 5. Line 5 is the output of the synchronizer circuit and will interface to the synchronous network.

Figure 2:
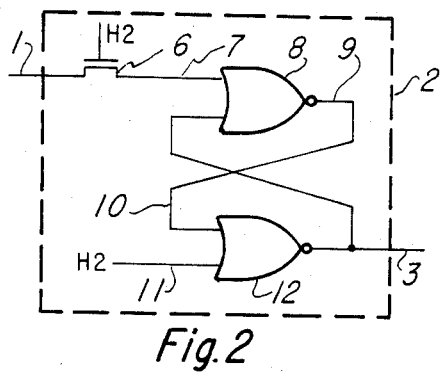
FIG. 2 is a schematic of a flip flop storage latch used in the synchronizer shown in FIG. 1.

Referring now to FIG. 2, the contents of block 2 is a simple S-R flip flop of two NOR gates connected as illustrated. In this circuit configuration, the flip flop is cleared on the occurrence of a clock pulse, H2. At the end of H2, any level present on line 1 is sampled by device 6 and transmitted to the flip flop on line 7. It should be noted that device 6 is also clocked by H2; thus the sampling occurs at the end of the signal that clears the flip flop in block 2. Therefore, the occurrence of an asynchronous event on line 1 at the falling edge of H2 will be transmitted to the flip flop in block 2 via device 6 and through line 7 into the NOR gate 8. At the point line 7 transmits the asynchronous occurrence, the H2 input to NOR gate 12 is at "0", i.e., the falling edge of H2. Therefore, the input to the flip flop is a 0. The occurrence of a "1" on line 7 will produce an output of a logic "0" on line 9 from NOR gate 8 which is transmitted to the input of NOR gate 12 via line 10. Since the value on line 11 is also "0", the output of NOR gate 12 on line 3 becomes a "1", signifying the occurrence of the asynchronous event on line "1".

The use of this type of the S-R flip flop with the clocked gate device 6 and clocked clearing on line 11 reduces the probability of a metastable state occurring since the beta ratios of the two NOR gates, 8 and 12, may be adjusted to decrease the time required for a transition from a logic "0" to a logic "1". The beta for a transistor is equal to the width of the channel over the channel length. The beta ratio for the NOR gate then is the ratio of the beta for the drive transistor over the beta for the load transistor. By constructing the NOR gates such that the beta for NOR gate 8 is much higher than the beta for NOR gate 12, the transition from a logic "0" to a logic "1" occurs in a minimum amount of time. By making this transition occur as quickly as possible, the probability of causing a metastable condition in other elements in the synchronous system is minimized.

Figure 3:
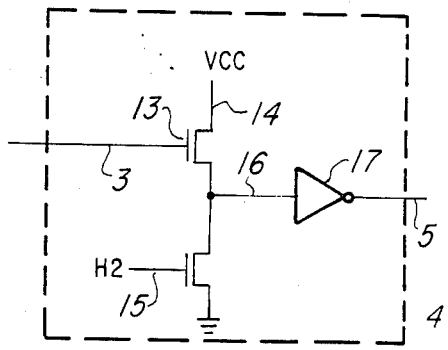
FIG. 3 is a schematic diagram of the level sensitive circuit used in the synchronizer shown in FIG. 1.

The output from the flip flop 2 is contained on line 3 and is inputted into block 4. Block 4 contains a level sensitive circuit which is illustrated in FIG. 3. The level sensitive circuit acts as a metastable condition resistor circuit. The output from the flip flop on line 3 is inputted into device 13. Note that H2 is also inputted into the device 15 which is connected with device 13. The source of device 13 is connected by line 14 to Vcc. The drain of device 13 is then connected to node 16 and also to the source of device 15. The drain of device 15 is connected to ground. Device 15 provides a clearing of the level sensitive circuit during H2. Note that during H2, both the flip flop and the level sensitive circuit are cleared. The output of the transisitor portion of the circuit is placed on line 16 which is connected to inverter 17. The output of the level sensitive circuit is then present on line 5. The level sensitive circuit takes the input on line 3 and produces an output on line 5 in such a manner that any metastable condition that can exist on line 3 will not be transmitted to line 5. The level sensitive circuit 4 makes use of the nonlinear switching characteristics of device 13. For example, if the flip flop 2 entered a metastable state the output voltage on line 3 would be typically about 0.7 volts which would be inputted into transistor 13 causing the voltage on line 16 to be at or a little above 0 volts, thus not affecting a change of state in inverter 17 since inverter 17 requires 1 volt to change states. The voltage at node 16 is cleared or zeroed on every H2 occurrence to minimize the building up of a charge which might cause a runt signal to be transferred through inverter 17 onto the output line 5. When line 3, however, reaches a volt or more, the transistor 13 starts to switch, causing the output on line 16 to switch. The level sensitive circuit 4 is so arranged that when transistor 13 begins to change state, the flip flop 2 has already started the 0 to 1 transition and is well passed any metastable condition. Thus the time that level sensitive circuit spends in any possible metastable condition is at a minimum. Therefore the circuit has two basic advantages. The first is that the level sensitive circuit tends to block the propagation of any metastable state from the previous flip flop 2 to any other synchronous devices connected to the level sensitive circuit on line 5. The second advantage is that this device produces a very quick transition when the flip flop 2 begins its transition relying on the switching characteristics of transistor 13. Therefore, the output on line 5 is a synchronized output and the probability on line 5 being in a metastable state is minimized.

Figure 4:
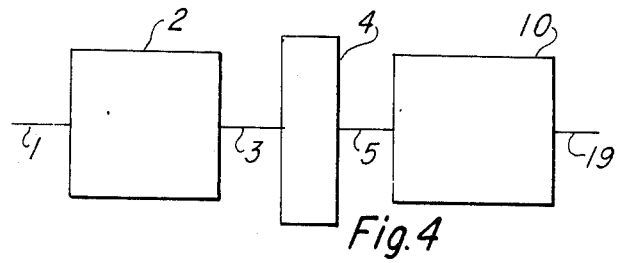
FIG. 4 is a block diagram of a second embodiment of the synchronizer.

FIG. 4 illustrates another embodiment of this invention. The asynchronous event is inputted on line 1 into a device 2, being the flip flop 2 earlier discussed. The output of the flip flop 2 is placed on line 3 which is then inputted into the level sensitive circuit 4 as previously discussed. The output of the level sensitive circuit 4 is placed on line 5 which is then placed into block 18. The output of block 18 is then placed on line 19.

Figure 5:
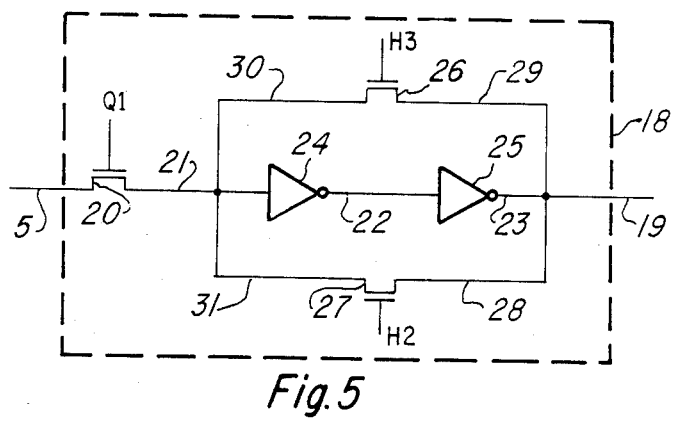
FIG. 5 is a schematic diagram of the latch used in the synchronizer shown in FIG. 4.

The contents of block 18 are illustrated in FIG. 5. Block 18 is a simple dual inverter latch placed in parallel with two transistor devices, 26 and 27, which are clocked by H3 and H2, respectively. The input to this inverter is clocked by a signal, $Q^1$, in device 20. Therefore, the existence of an input on line 5 is clocked in through device 20 upon the occurrence of $Q^1$ onto line 21 where it is stored in inverter 24, transmitted over line 22 to inverter 25 which also places an output on line 23.

Figure 6:
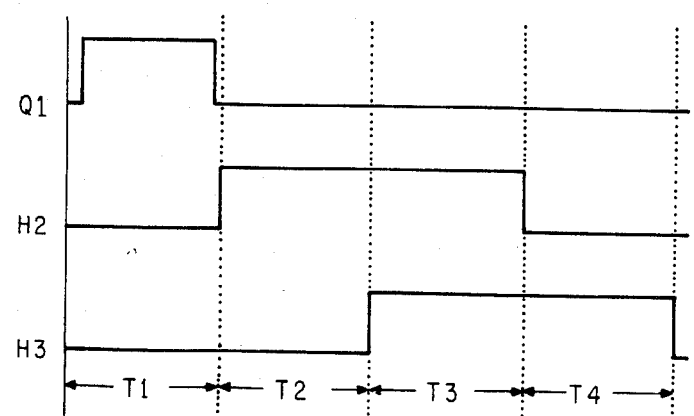
FIG. 6 is a timing diagram of the inputs to the latch circuitry in FIG. 5.

The contents of these inverters are refreshed during the occurrence of H3 and H2. The timing relationships of $Q^1$, H2 and H3 are illustrated in FIG. 6. When an output is present on line 5, it is clocked through device 20, when $Q^1$ becomes high, onto line 21 where it is then placed into inverter 24. The output of inverter 24 is a "0" when a "1" is present on line 5. Line 22 is then inputted into inverter 25 with an output on line 23. If line 5 contains a logic "1", then the output on line 23 will be logic "1". During the occurrence of H2, the output on line 23 is fed back to inverter 24 via line 28 through device 27 and clocked by H2 onto line 31. During the occurrence of H3, the output of line 23 is also fed back to inverter 24 via line 29 through device 26 via H3 onto line 30.

Referring to FIG. 6, the occurrence of H2 and H3 overlap since the total machine cycle is made up of four minor cycles numbered in FIG. 6 as T1, T2, T3 and T4. The refresh cycle for the latch 18 is ¾ of a machine cycle. The inputs into latch 18 are only during Q1 which is less than ¼ of a machine cycle. Allowing the fedback to occur during ¾ of a machine cycle, the probability of any metastable condition existing in the latch will be minimized since any transient signals will be allowed to die out.

Referring back to FIG. 4, the digital synchronizer illustrated consists of two latches, 2 and 18, and a level sensitive circuit 4 connected between them. The addition of latch 18 provides the storage of asynchronous condition in latch 18 for processing by the synchronous network connected via a line 19. The resulting reliability of the synchronizer has been increased since the latch in block 2 has been designed using the beta ratio to maximize transition. The connection to the level sensitive circuit 4 effectively blocks any propagation that may occur in latch 2 and further provides a quick transition on line 5 when any transition occurs at latch 2. Also the level sensitive circuit 4 is initialized during H2. The output of the level sensitive circuit 5 is then placed into latch 18 which minimizes the occurrence of any metastable condition by a fedback cycle of ¾ of the machine cycle as discussed.

Figure 7:
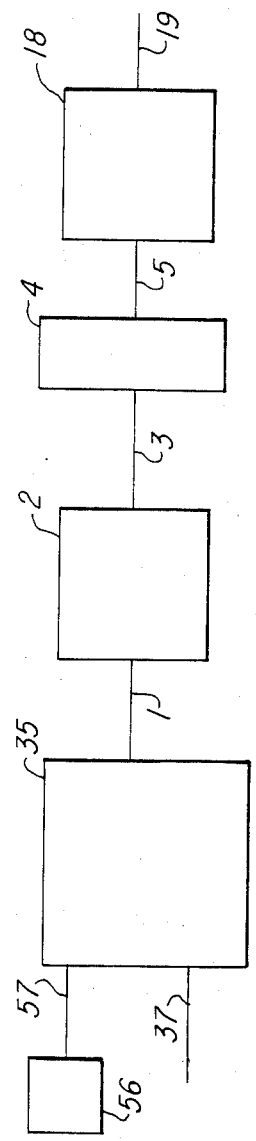
FIG. 7 is a block diagram of an embodiment of the synchronizer including input circuitry to receive both an asynchronous pulse and an asynchronous level.

A further embodiment of this invention is illustrated in FIG. 7. In FIG. 7 block 35 has been added to the synchronizer circuit connected to line 1. Block 35 represents the input circuitry to the synchronizer. Pad 56 is a pad for the input signal to block 35 via line 57. Either a level input or pulse input may be provided to pad 56. Further, multiple level inputs may be wire ORed and inputted to the synchronizer on pad 56. Line 37 represents the reset line provided to reset the pulse input portion of the input circuitry 35 by the processor system.

Figure 8:
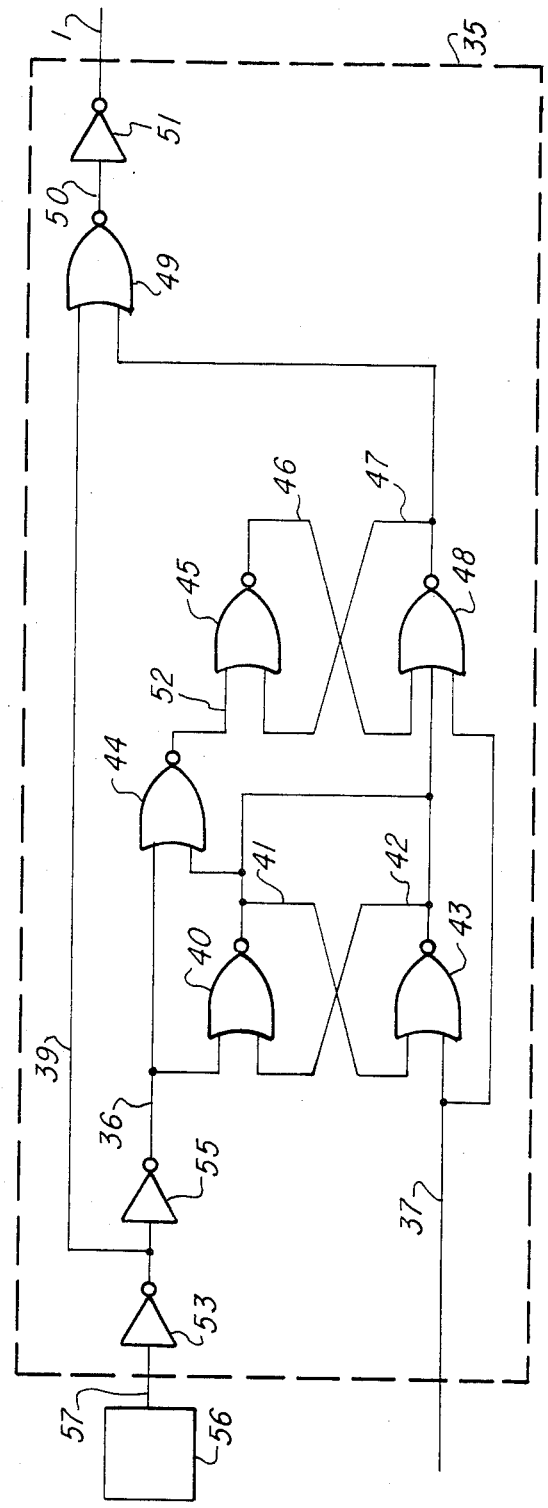
FIG. 8 is a schematic diagram of the input circuitry illustrated in FIG. 7.
Figure 9A:
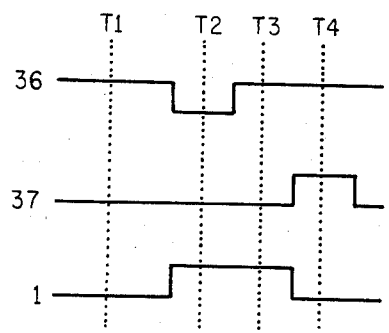
FIG. 9a is a timing diagram illustrating a pulse input to the input circuitry 35 of the digital synchronizer followed by a reset signal.
Figure 9B:
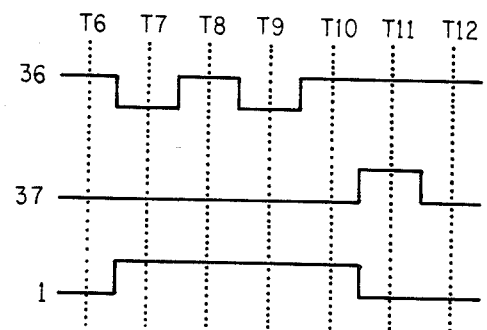
FIG. 9b is a timing diagram of the input circuitry 35 illustrating two pulse inputs followed by a reset signal.
Figure 9C:
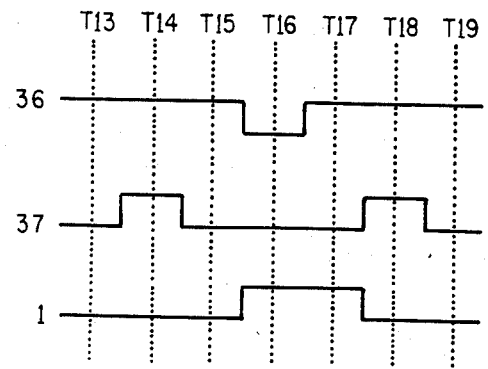
FIG. 9c is a timing diagram of the input circuitry 35 illustrating a reset signal followed by an input pulse, followed by a reset signal.

The input circuitry in block 35 is illustrated in FIG. 8. This circuitry provides an output on line 1 when either a level input or a pulse input is provided. Pad 56 receives the input signal, which in this embodiment is active low. This input is coupled to inverter 53 via line 57. The output of inverter 53 on line 39 is connected to NOR gate 49. The output of inverter 53 is also inputted to inverter 55 whose output on line 36 is input to the pulse circuitry. A pulse input signal on line 36 will produce a level output on node 47 which is also connected to NOR gate 49. Therefore, when either a level input or a pulse input is present, NOR gate 49 will provide an output on line 50. This signal is in turn inverted by inverter 51 to provide a high level output on line 1 to the reminder of the synchronizer circuit as previously discussed. The circuitry provided to receive the pulse signal on line 36 provides a level output on node 47 at the falling edge of the pulse at line 36. Representative timing diagrams of this pulse input circuitry is illustrated in FIGS. 9a, 9b and 9c. This pulse input circuitry consists of two flip flops connected with a NOR gate. The first flip flop consists of NOR gates 40 and 43. The output of NOR gate 40, node 41, is connected to NOR gate 44 which connects the first flip flop (NOR gates 40 and 43) to the second flip flop (NOR gates 45 and 48).

Referring now to FIG. 9a, at $T_1$ during the initialization state, line 36 is high and line 37 is low. The state of the first flip flop (NOR gates 40 and 43) at node 41 is a "0" and at node 42 "1". The output of NOR gate 44 is a "0" since a "0" is present on node 41 and a "1" is present on line 36. The NOR gate 44 output is coupled into NOR gate 45 of the second flip flop (NOR gates 45 and 48) via line 52. The initial state of the second flip flop (NOR gates 45 and 48) at node 46 is "1" and at node 47 "0". At $T_2$ line 36 drops to "0". However, the state of the first flip flop (NOR gates 40 and 43) remains as before with node 41 at "0" and node 42 at "1". The inputs to NOR gate 44 are "0" from line 36 and a "0" from node 41, thus causing a "1" on line 52 which causes the second flip flop (NOR gates 45 and 48) to change. Node 47 now becomes a "1" and node 46 becomes a "0". Node 47 is inputted to NOR gate 49 with line 39 which is a "1". The output of NOR gate 49 is a "0" which through inverter 51 becomes "1". It should be noted that the two flip flops in combination with NOR gate 44 provides a level output on the detection of the falling edge of a pulse on line 36 as shown by line 1 in FIG. 9a. At $T_3$ line 36 returns to a "1" without any effect on the output line 1. At $T_4$ line 36 is still "1", however, there is a reset pulse on line 37. The reset on line 37 causes the first flip flop (NOR gates 40 and 43) to change such that node 41 becomes a "1" node 42 becomes a "0". The output of NOR gate 44 becomes a "0" since the input on line 36 is a "0" but the input on node 41 is now a "1". The "0" is coupled via line 52 to NOR gate 45 of the second flip flop (NOR gates 45 and 48) and the reset signal on line 37 is coupled to the second flip flop (NOR gates 45 and 48) as an input into NOR gate 48. The reset input into NOR gate 48 causes the second flip flop (NOR gates 45 and 48) to reset such that node 46 becomes a "1" and node 47 becomes a "0". Line 1 then transitions to "0".

FIG. 9b illustrates a condition where two pulses are inputted on line 36 before a reset pulse is generated on line 37. At $T_6$ line 36 is "1" and line 37 is "0" in the initialized state and therefore line 1 is a "0". At $T_7$ the circuitry has detected the falling edge on line 36 and has set node 41 to a "1". At $T_9$ a second input pulse on line 36 is present, however, this does not change the state of the node 47 as shown. Node 47 remains a "1" until the rising edge of the reset pulse illustrated between $T_{11}$ and $T_{12}$. Therefore, line 36 provides a set signal illustrated by $T_7$ which causes the line 1 to become a transition from a "0" to a "1". However, additional pulses on line 36 will not affect the circuitry until after the circuitry has been reset by a signal on line 37.

FIG. 9c illustrates a condition where two reset pulses are inputted on line 37. In the initial state at $T_{13}$ line 36 is a "0" and line 37 is a "0" and line 1 is a "0". At $T_{14}$ a reset signal is present on line 37, however, this pulse merely provides a reset signal to the second flip flop (NOR gates 45 and 48) thus not causing any change of state of node 47. Likewise, at $T_{15}$ the two input (lines 36 and 37) are "1" and "0" respectively, therefore there is no change of state of either of the two flip flops. At $T_{16}$ an input pulse is present on line 36. At the falling edge of the impulse, line 1 transitions from a "0" to a "1" as previously discussed. At $T_{17}$ an output remains present on line 1 due to the detection of a "1" to "0" transistion on line 36. At $T_{18}$ a second reset signal is present on line 37. At the rise of this reset signal, the output line 47 transitions from a "1" to a "0" as previously discussed. Therefore, the pulse detection circuitry comparing the first flip flop (NOR gates 40 and 43) and the second flip (NOR gates 45 and 48) coupled by NOR gate 44 provide a level output on node 47 to line 1 upon the detection of a "1" to "0" transition on line 36. This level output is reset by a detection of a "0" to "1" transition on line 37. The circuitry in block 35 will then provide an output on line 1 when either a level input is present on line 39 or a pulse input is provided on line 36.

Figure 9D:
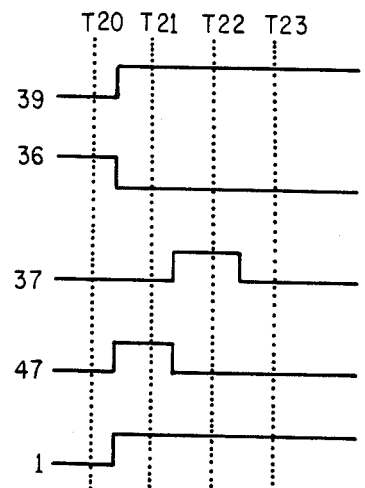
FIG. 9d is a timing diagram of the input circuitry 35 illustrating the input of a level signal.

FIG. 9d illustrates the occurrence of an active low level input to pad 56. Line 39 goes high since the signal is being inverted by inverter 53. Also line 36, output from inverter 55, goes low. As a result of the "1" to "0" transition of line 36, node 47 goes high. As a result of node 47 being high and line 39 being high, the output on line 1 is high as shown at $T_{21}$. At $T_{22}$ the pulse circuitry is reset from the interrupt hardware in the processor. Therefore node 47 returns to "0" even though line 39 is high and line 36 remains low. Note that line 1 remains high even with node 47 at "0" since line 39 is high. At $T_{23}$, line 1 remains high as a result of line 39 being high.

This input circuitry is suggested for use in computer interrupt applications. This circuitry allows either a level interrupt or a pulse interrupt to be input to the computer. It is suggested that the interrupt hardware circuitry provide the reset signal on line 37. This allows for speedy reset of the pulse input circuitry in order that additional pulse or level interrupts may be received. Further level interrupts may be wire ORed to the input pad 56. Therefore if one device provides a level interrupt and a second device provides a second level input, reseting the first device and lowering its interrupt will not interfere with the interrupt from the second device.

What is claimed is:

1. A digital synchronizer for connection to a synchronous system to prevent the propagation of a metastable condition, the digital synchronizer comprising:
  input means for receiving of an input signal which comprises one of an input voltage level signal and an input pulse signal and to provide a voltage level as an output signal;
  latch means having a latch input connected to the output of said input means for storing the output signal thereof;
  output means having an input coupled to the output of the latch means for producing an output signal at an output terminal only when the output signal of the latch means has a voltage magnitude which exceeds a predetermined threshold value which is greater than the metastable voltage value of the latch means.

2. The digital synchronizer according to claim 1, wherein the output means includes an inverter.

3. The synchronizer according to claim 1, wherein said latch means comprises:
  first and second logic gate means electrically connected in cascade arrangement with the first logic gate means coupled for receiving the input signal and also coupled for receiving the output of the second logic gate means and the second logic gate means coupled for receiving a clearing signal and coupled for receiving the output of the first logic gate, the output of the second logic gate means being the latch means output.

4. The synchronizer according to claim 3 wherein said first logic gate means comprises a first transistor means and said second logic gate means comprises a second transistor means and said first transistor means has a beta ratio substantially higher than the beta ratio of the second transistor means.

5. The digital synchronizer according to claim 2, wherein said output means comprises:
  first and second field effect transistors, the first field-effect transistor's source being connected to receive a supply voltage, the first field-effect transistor's gate being connected to the output of the latch means, the first field-effect transistor's drain being connected to the source of the second field-effect transistor and connected to the input of the inverter, the gate of the second field-effect transistor being connected to receive a clearing signal for resetting the output of the output means to a predetermined logic state, the drain of the second field-effect transistor being connected to the ground, and the output of the inverter being the output of the synchronizer.

6. The digital synchronizer according to claim 1, wherein the input means includes first input means for receiving an asynchronous level, second input means for receiving an asynchronous pulse, and third input means connected to the first and the second input means for producing a level output that represents an input applied to either the first or second input means.

7. The digital synchronizer according to claim 6, wherein the second input means includes a D-type flip flop.

8. A digital synchronizer comprising:
  input means for receiving an input signal which comprises one of a voltage level input signal and an input pulse signal and to provide as an output a voltage level thereby;
  signal storage means for storing the voltage level from said input means; and
  circuit means for producing an output upon receipt from said storage means of a predetermined voltage level greater than the metastable voltage of the storage means, the circuit means' input being connected to the storage means' output.

9. The digital synchronizer according to claim 8 wherein said storage means includes a clocked input means for gating the output of the input means to the signal storage means.

10. The digital synchronizer according to claim 9, wherein said circuit means receives the clocked input for initializing the circuit means.

11. The digital synchronizer according to claim 8, wherein the input means includes first input means for receiving of an asynchronous level, second input means for receiving of an asynchronous pulse, and third input means connected to the first and the second input means for producing a level output upon receiving of an input from either the first or second input means.

12. The digital synchronizer according to claim 11, wherein the second input means includes a D-type flip flop.

13. A digital synchronizer comprising:

input means for receiving of an input signal comprising one of an input voltage level signal or an input pulse signal and to provide an output voltage level as an output;

first signal storage means connected to said input means for storing of the output voltage level and to provide a first signal thereby;

circuit means for producing an output upon reception from said first signal storage means of the first signal having a predetermined input voltage level greater than the metastable voltage of the first signal storage means and whose input is connected to the first signal storage means output; and second signal storage means having an output terminal and whose input is connected to the output of the circuit means for storing of the output of the circuit means and to provide the synchronizer output at the output terminal.

14. The digital synchronizer according to claim 13, wherein the second signal storage means further comprises;

a switching device coupled to a latch for selectively coupling the output of the circuit means to the second signal storage means.

* * * * *